United States Patent [19]

Hanna et al.

[11] Patent Number: 5,489,220
[45] Date of Patent: Feb. 6, 1996

[54] FILTER CONNECTOR ARRANGEMENT HAVING A FERRITE BARREL WITH A RECTANGULAR BORE

[75] Inventors: Taj F. Hanna, Hummelstown; Stanley W. Olson, East Berlin; Charles J. Trexler; Wayne G. Weigard, both of York, all of Pa.

[73] Assignee: Berg Technology, Inc., Reno, Nev.

[21] Appl. No.: 317,284

[22] Filed: Oct. 3, 1994

Related U.S. Application Data

[63] Continuation of Ser. No. 53,486, Apr. 28, 1993, abandoned, which is a continuation of Ser. No. 968,694, Oct. 30, 1992, abandoned.

[51] Int. Cl.⁶ .................................................. H01R 13/66
[52] U.S. Cl. ............................................. 439/620; 439/736
[58] Field of Search ................................... 439/620, 667, 439/877, 677–679, 736; 333/189

[56] References Cited

U.S. PATENT DOCUMENTS

| | | | |
|---|---|---|---|
| Re. 29,258 | 6/1977 | Fritz | 333/70 |
| 2,032,501 | 3/1936 | Reynolds | 439/679 X |
| 2,089,844 | 8/1937 | Anderson | 439/679 X |
| 3,370,265 | 2/1968 | Berg | 339/256 |
| 3,539,954 | 11/1970 | Camire | 333/79 |
| 3,781,723 | 12/1973 | Harwood | 333/79 |
| 4,020,430 | 4/1977 | Vander Heyden | 333/183 |
| 4,032,215 | 6/1977 | Jarmofsky et al. | 439/877 X |
| 4,401,355 | 8/1983 | Young | 339/147 R |
| 4,571,561 | 2/1986 | Fujiki et al. | 333/184 |
| 4,647,122 | 3/1987 | Kelly | 339/14 R |
| 4,682,129 | 7/1987 | Bakermans et al. | 333/184 |
| 4,751,479 | 6/1988 | Parr | 333/184 X |
| 4,791,391 | 12/1988 | Linnell et al. | 333/184 |
| 5,178,547 | 1/1993 | Bonas et al. | 439/34 |
| 5,200,574 | 4/1993 | Cunningham et al. | 102/530 |
| 5,241,910 | 9/1993 | Cunningham et al. | 102/530 |

FOREIGN PATENT DOCUMENTS

| | | | |
|---|---|---|---|
| 512682 | 11/1992 | European Pat. Off. | F42B 3/04 |
| 4012480 | 4/1990 | Japan | H01R 13/71 |

*Primary Examiner*—David L. Pirlot
*Assistant Examiner*—Daniel Wittels
*Attorney, Agent, or Firm*—Woodcock Washburn Kurtz Mackiewicz & Norris

[57] ABSTRACT

A filter connector has a ferrite barrel with a rectangular bore therethrough. The configuration of the bore closely matches the substantially rectangular cross sectional configuration of an electrical connector received within the bore. The connector has a pair of wings upstanding from a base thereof. A single gate or a cooperating pair of gates is(are) attached to one or both of the wings. When folded the gate(s) close the bore through the barrel.

4 Claims, 3 Drawing Sheets

FILTER CONNECTOR ARRANGEMENT HAVING A FERRITE BARREL WITH A RECTANGULAR BORE

This is a continuation of application Ser. No. 08/053,486, filed Apr. 28, 1993, now abandoned, which is a continuation of patent application Ser. No. 07/968,694, filed Oct. 30, 1992 abandoned.

BACKGROUND OF THE INVENTION

1. Field of the Invention

The present invention relates to a filter connector.

2. Description of the Prior Art

A filter connector is an arrangement that is commonly used in various applications, such as in electrical detonator circuits, to control electromagnetic interference ("EMI") effects. The filter connector arrangement includes an electrical connector device with a filter member associated therewith. U.S. Pat. Nos. 3,539,954 (Camire); 4,401,355 (Young); 4,647,122 (Kelly); 3,781,723 (Harwood); and 4,020,430 (Vander Heyden) each exemplify a filter connector arrangement.

In the context of an electrically triggered detonator such as those utilized to actuate an automobile airbag system, a ferrite barrel is used as the filter member. The ferrite barrel increases the inductance of the firing circuit to provide protection against EMI effects. An end elevational view of such a filter connector arrangement is shown in FIG. 1. The ferrite barrel F is a generally cylindrical member having a pair of bores $B_1$, $B_2$ therein. Each cylindrical bore has a respective axis $A_1$, $A_2$ extending therethrough. The cross sectional configuration of each bore $B_1$, $B_2$ in a plane perpendicular to the respective axis $A_1$, $A_2$ thereof is substantially circular. Each bore $B_1$, $B_2$ receives an electrical connector C therein. The connectors C terminate a firing control circuit and provide a receptacle for the pin terminals of the airbag detonator circuit. Suitable for use as the connector C in FIG. 1 is the connector manufactured by Du Pont Connector Systems and sold as Jumbo PV™ connector. U.S. Pat. No. 3,370,265 (Berg) discloses such a connector. This patent is hereby incorporated by reference. This connector C exhibits a generally rectangular configuration in a plane perpendicular to its axis.

Problems of implementation develop when a ferrite barrel F such as that shown in FIG. 1 is used to surround an electrical connector having a generally rectangular cross section such as that shown by the reference character C. One implementation problem is simply the physical difficulty of locating and fitting a rectangular connector C into a cylindrical bore $B_1$, $B_2$. Tolerances in such an instance become extremely tight and special location features must be developed. Moreover, special care must be taken to fix the connector properly within the bore.

A second problem is generated when the barrel is overmolded, or surrounded by an encapsulating material. The possibility exists that injected plastic overmolding material may enter into the bore $B_1$, $B_2$ of the ferrite barrel F and interfere with the proper operation of the spring biased contact beam of the connector C.

Finally, when a connector C with a rectangular configuration is received within the cylindrical bore $B_1$, $B_2$ of the barrel F optimum electrical performance is not obtainable.

In view of the the foregoing it is believed advantageous to provide a filter connector arrangement that overcomes the above-mentioned difficulties.

SUMMARY OF THE INVENTION

The present invention relates to a filter connector having a ferrite barrel with a bore therethrough and an electrical connector therein. The connector has a substantially rectangular cross sectional configuration in a plane perpendicular to its axis. In accordance with the present invention the cross sectional configuration of the bore through the barrel in a plane perpendicular to the axis thereof is substantially rectangular. The term "rectangular" is to be construed to encompass a connector and a bore that is square in cross sectional configuration.

Also disclosed is an electrical connector receivable within the bore in the barrel. The connector has a base with a pair of wings upstanding therefrom. In one embodiment a gate having a substantially rectangular configuration is attached to one of the wings. The gate is foldable with respect to the one wing to close the bore through the barrel when the connector is received therein. In a modified embodiment of the connector a gate is attached to each of the wings with each gate having a substantially rectangular configuration. Each gate is foldable with respect to the wing to which they are attached to a position which closes the bore through the core when the connector is received therein.

BRIEF DESCRIPTION OF THE DRAWINGS

The invention will be more fully understood from the following detailed description, taken in accordance with the accompanying drawings, which form a part of this application and in which.

DETAILED DESCRIPTION OF THE INVENTION

Figure 1:
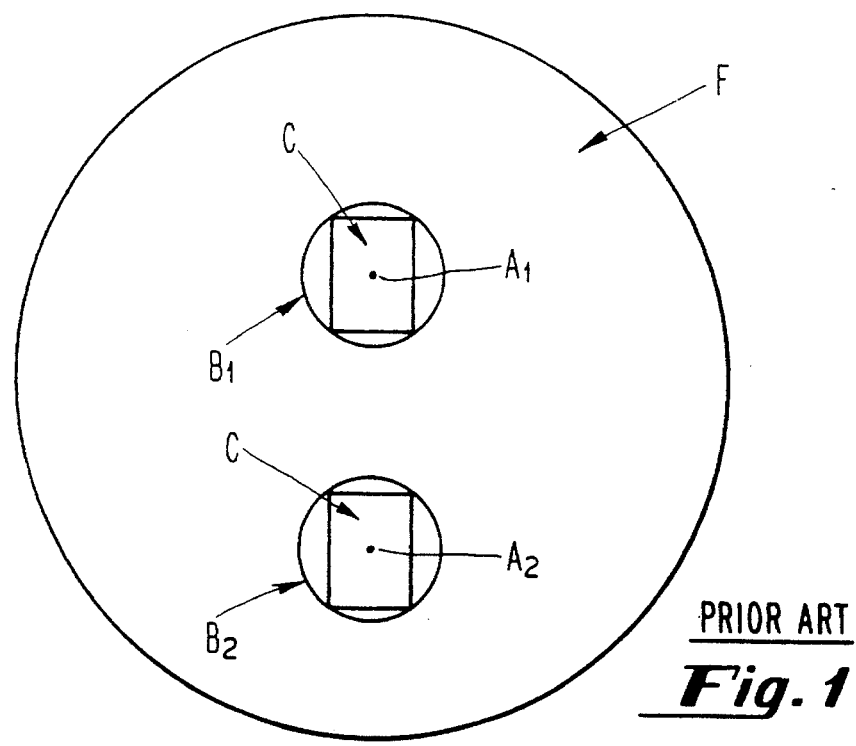
FIG. 1 is an end elevational view of a prior art filter connector using a ferrite barrel having a cylindrical bore.

Throughout this application similar reference numerals refer to similar elements in all Figures of the drawings.

Figure 2:
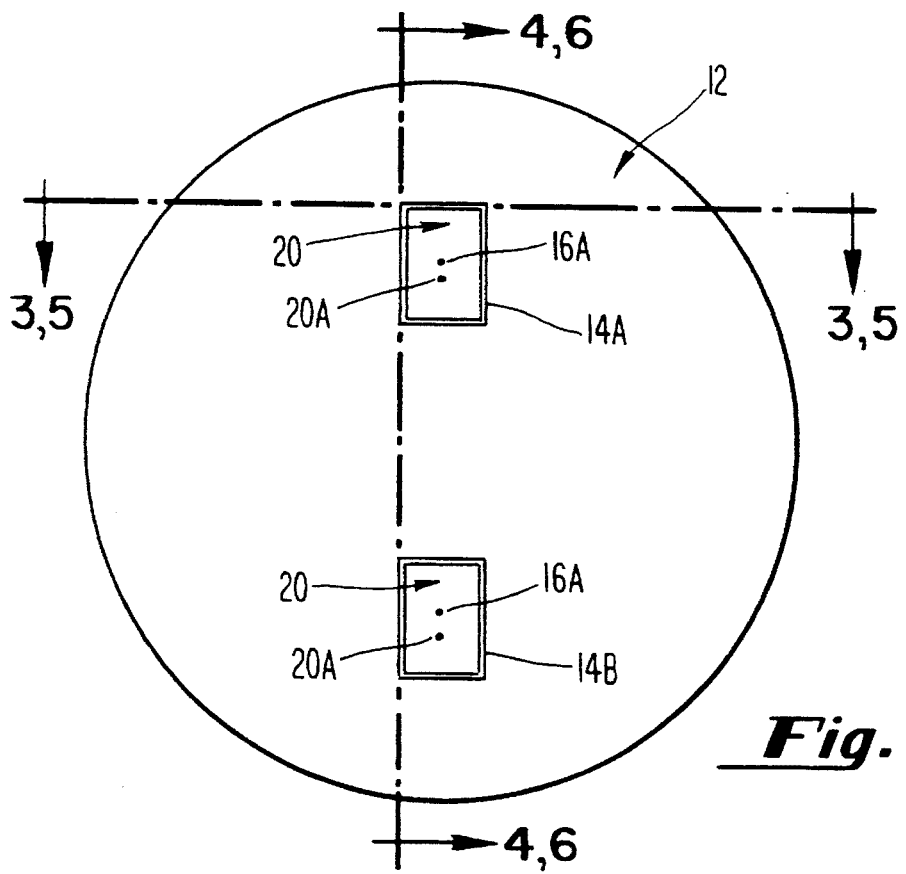
FIG. 2 is an end/elevational view of a filter connector in accordance with the present invention in which the ferrite barrel has a rectangular bore.

FIG. 2 shows a filter connector arrangement generally indicated by the reference character 10. The filter connector 10 includes a ferrite barrel 12 having bores 14A, 14B therein. Each bore 14A, 14B has a respective axis 16A, 16B extending therethrough. The filter connector 10 further includes an electrical connector device 20 received within each bore 14A, 14B. In accordance with the present invention the bores 14A, 14B in the barrel 12 exhibit a substantially rectangular configuration in a plane perpendicular to the respective axis 16A, 16B thereof. By casting the ferrite barrel to exhibit bores of rectangular configuration the physical difficulty of locating and fitting a rectangular connector 20 into the bore is eliminated. No special locational features or tight tolerances are required to maintain the connector 20 in the proper location in the barrel 12. For clarity of illustration in FIG. 3 through 6, a connector 20 is shown in only one of the bores. Moreover, it should be realized that the connector 20 is closely received within the bore in which it is disposed, with the spacing surrounding the connector in FIG. 2 being provided for clarity of illustration. The close receipt of the connector 20 within the barrel helps prevent entry of encapsulating material into the bore during overmolding. As used throughout this application the term "rectangular" is to be construed to encompasss both rectangular and square cross sectional configurations.

Figure 3:
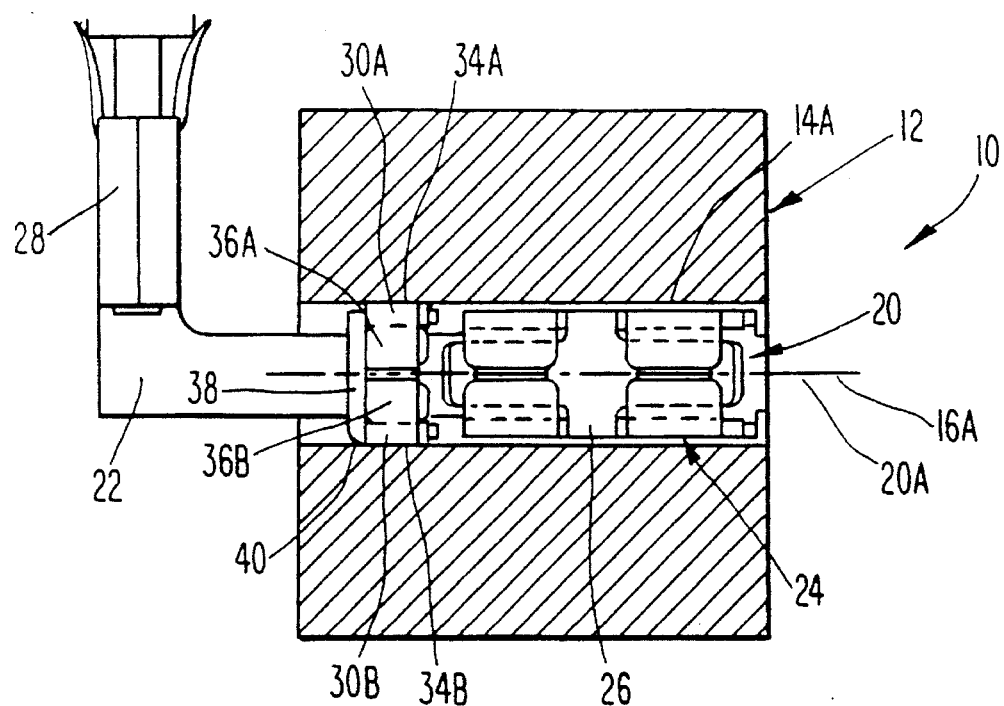
FIGS. 3 and 4 are respective sectional views taken along section lines 3—3 and section lines 4—4 in FIG. 2 illustrating in plan and side elevation the structural details of the connector device used in the filter connector arrangement in accordance with the present invention.
Figure 4:
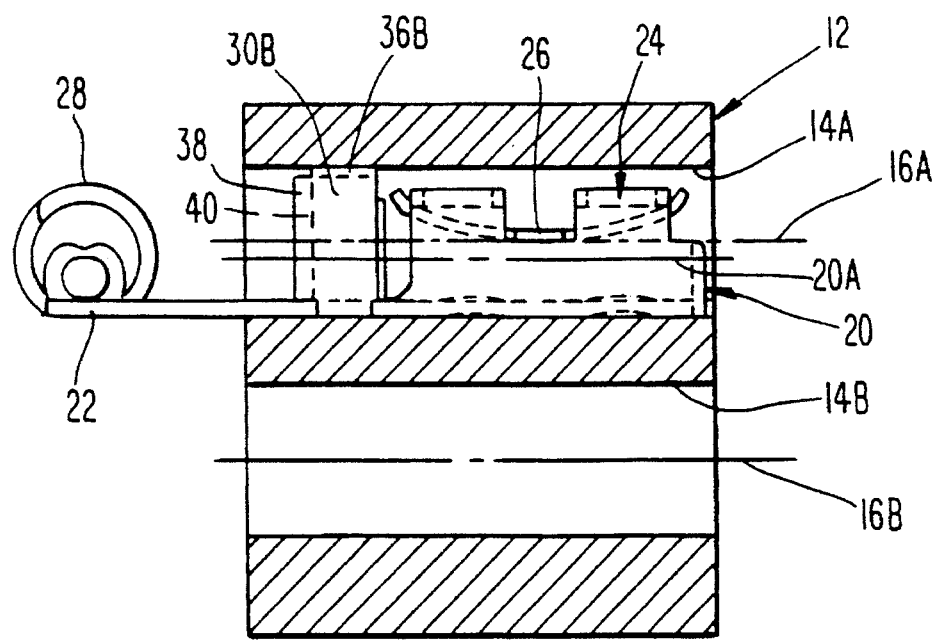

FIGS. 3 and 4 are sectional views through the barrel 12 illustrating the connector 20. The connector 20 is generally similar to the device disclosed in U.S. Pat. No. 3,370,265 (Berg) which is incorporated by reference herein. The connector 20 has an axis 20A and includes a base 22 having a socket 24 disposed at the forward end thereof. The socket 24 has a spring biased bowed beam 26 therein. A crimpable wire ferrule 28 is provided adjacent to the rearward end of the base 20.

The connector 20 is modified over the device shown in the above-incorporated patent to exhibit a pair of wings 30A, 30B formed along each lateral edge of the base 22 immediately rearwardly of the socket 24. The upper portion of each of the upstanding wings 30A, 30B is folded along a respective fold line 34A, 34B to define resilient fingers 36A, 36B at the upper extent of the wings 30A, 30B. As best seen in FIG. 4, when the connector 20 is received within the bores 14A, 14B of the barrel 12 the fingers 36A, 36B act against the barrel 12 to hold the connector 20 in place.

In the embodiment shown in FIGS. 3 and 4 a single gate panel 38 is foldably attached to a selected one of the wings 30A, 30B, as the case may be. The gate panel 38 is substantially rectangular in configuration. As shown in FIGS. 3 and 4, when folded along the fold line 40 with the associated wing so as to overlie the base 22, the panel 38 serves to close the bore 14A, 14B in which the connector is disposed to prevent the ingress of overmolding material. No further arrangement need be provided to seal the bore.

Figure 5:
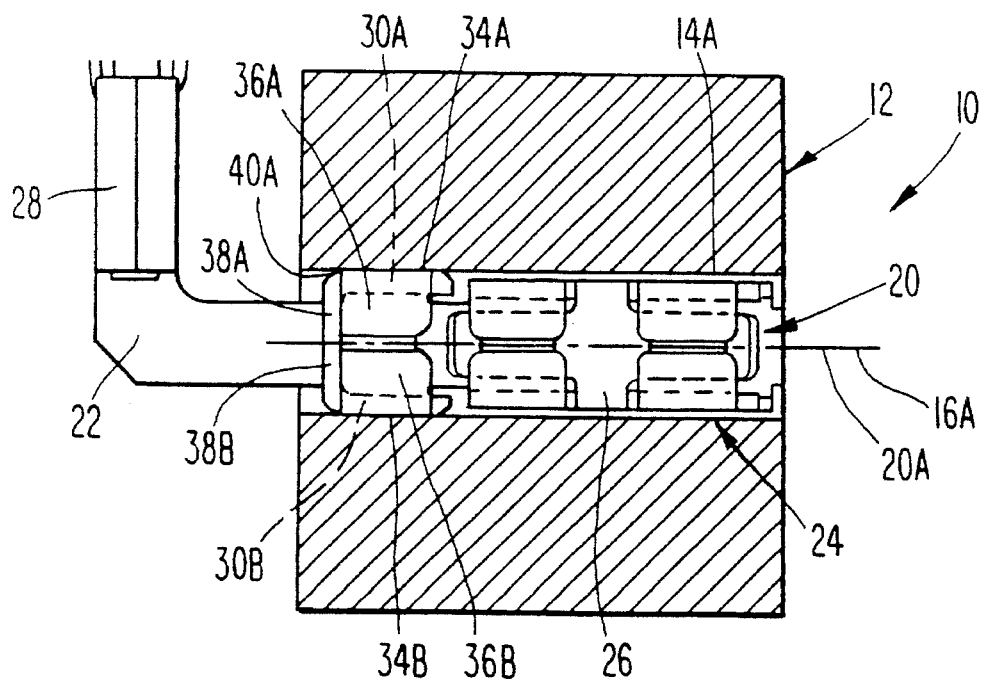
FIGS. 5 and 6 are sectional views similar to those of FIGS. 3 and 4 illustrating in plan and in side elevation a modification to the connector device of FIGS. 3 and 4.
Figure 6:
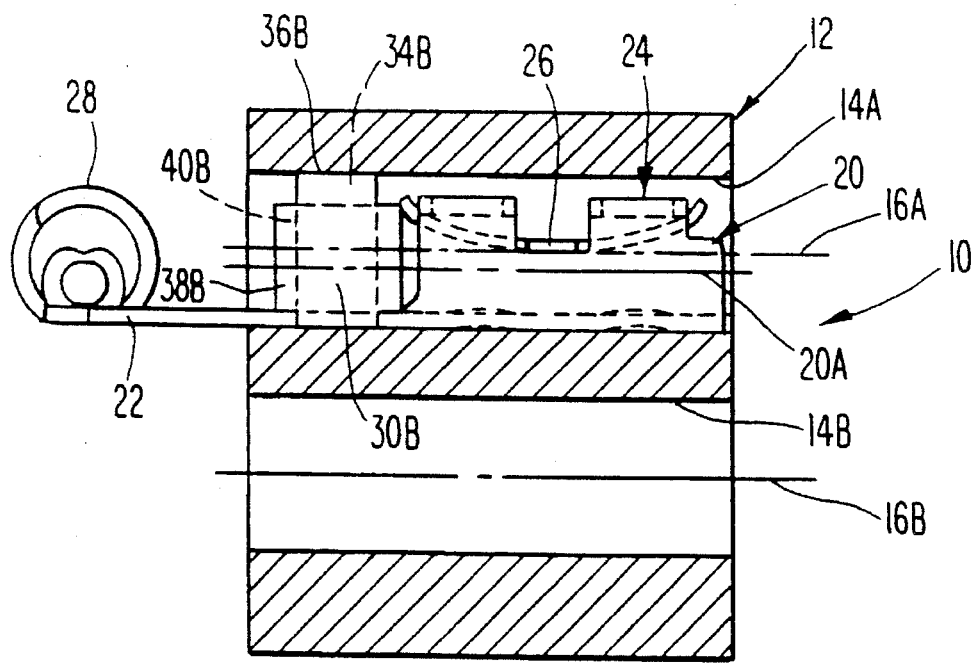

The connector 20 shown in FIGS. 5 and 6 is generally similar to that described in connection with FIGS. 3 and 4, with the exception that each of the wings 30A, 30B has a gate panel 38A, 38B defined thereon. The gate panels 38A, 38B each have a substantially rectangular configuration. Each gate panel 38A, 38B is foldable with respect to its associated wing along a respective fold line 40A, 40B. When in the position shown in the FIGS. 5 and 6, in which the gate panels 38A, 38B are folded to overlie the base 22, the panels 38A, 38B cooperate to close the bore 14 in which the connector 20 is disposed. As a result, the ingress of injected plastic overmolding material into the bore 14 is precluded.

By providing a bore 14A, 14B within the barrel 12 that is rectangular to conform in cross sectional configuration to the connector 20 received therein the electrical performance of the filter is enhanced. Simulations of the magnetic performance of a filter connector using a ferrite barrel with a cylindrical bore (FIG. 1) and a filter connector using a ferrite barrel with a rectangular bore (FIG. 2) and having, in each instance, the same connector device therein, indicates that the inductance presented by the barrel with the rectangular bore is approximately five times that of the inductance presented by the barrel with the cylindrical bore, for both the differential current mode and the common current mode.

The differential and common mode inductance are summarized as follows (with ferrite permeability equal to 1000):

| Barrel Bore Configuration | Differential mode Inductance | Common mode Inductance |
| --- | --- | --- |
| Cylindrical | 137 Nano Hy. | 61.4 Nano Hy. |
| Rectangular | 656 Nano Hy. | 302 Nano Hy. |

Those skilled in the art, having the benefit of the teachings of the present invention as hereinabove set forth may effect numerous modifications thereto. Such modifications as are discussed herein and which appear to those skilled in the art are to be construed as lying within the scope of the present invention, as defined by the appended claims.

What is claimed is:

1. A connector for a filter connector arrangement having a ferrite barrel with a bore therethrough and an overmold material which encapsulates said ferrite barrel, the connector comprising a connection assembly, a base, a pair of wings upstanding from the base, and a gate attached to one of the wings, the gate having a configuration substantially the same as a cross-section of said bore, the gate being foldable with respect to the one wing to close the bore through the barrel to substantially prevent said overmold material from passing into said ferrite bore to affect said connection assembly when the connector is received in said ferrite bore.

2. A connector for a filter connector arrangement having a ferrite barrel with a bore therethrough and an overmold material which encapsulates said ferrite barrel, the connector comprising a connection assembly, a base, a pair of wings upstanding from the base, and a gate attached to each of the wings, the gates together having a configuration substantially the same as a cross-section of said bore, the gates being foldable with respect to the wing to which they are attached to a position which closes the bore through the barrel to substantially prevent said overmold material from passing into said ferrite bore to affect said connection assembly when the connector is received in said ferrite bore.

3. A filter connector arrangement comprising:

a ferrite barrel having a substantially rectangular bore therethrough;

an overmold material which encapsulates said ferrite barrel; and an electrical connector having a substantially rectangular cross-sectional configuration in a plane perpendicular to an axis of the connector, said connector comprising a connection assembly, a base, a pair of wings upstanding from the base, and a gate attached to one of the wings, the gate having a configuration substantially the same as a cross-section of said bore, said gate being foldable with respect to the one wing to close the bore through the barrel to substantially prevent said overmold material from passing into said ferrite bore to affect said connection assembly when the connector is received in said ferrite bore.

4. A filter connector arrangement comprising:

a ferrite barrel having a substantially rectangular bore therethrough;

an overmold material which encapsulates said ferrite barrel; and an electrical connector having a substantially rectangular cross-sectional configuration in a plane perpendicular to an axis of the connector, said connector comprising a connection assembly, a base, a pair of wings upstanding from the base, and a gate attached to each of the wings, the gates together having a configuration substantially the same as a cross-section of said bore, said gates being foldable with respect to the wing to which they are attached to a position which closes the bore through the barrel to substantially prevent said overmold material from passing into said ferrite bore to affect said connection assembly when the connector is received in said ferrite bore.

* * * * *